US012699121B2

(12) United States Patent　　　　(10) Patent No.:　　US 12,699,121 B2

Daniel　　　　　　　　　　　　　　(45) Date of Patent:　　　　Aug. 4, 2026

(54) METHOD FOR FAST CALCULATION OF ELECTRICAL NETWORK IMPEDANCES AT MANY FREQUENCIES AND MANY SYSTEM CONDITIONS

(71) Applicant: Hitachi Energy Ltd, Zürich (CH)

(72) Inventor: John Paul Daniel, Apex, NC (US)

(73) Assignee: HITACHI ENERGY LTD, Zürich (CH)

( * ) Notice:　　Subject to any disclaimer, the term of this patent is extended or adjusted under 35 U.S.C. 154(b) by 447 days.

(21) Appl. No.: 18/101,895

(22) Filed:　　Jan. 26, 2023

(65)　　　　　Prior Publication Data

US 2024/0255554 A1　　　Aug. 1, 2024

(51) Int. Cl.
　　　*G01R 19/25*　　　(2006.01)
　　　*G01R 31/08*　　　(2020.01)
(52) U.S. Cl.
　　　CPC ....... *G01R 19/2513* (2013.01); *G01R 31/088* (2013.01)
(58) Field of Classification Search
　　　CPC ......................... G01R 19/2513; G01R 31/088
　　　See application file for complete search history.

(56)　　　　　References Cited

U.S. PATENT DOCUMENTS

| | | | | | |
|---|---|---|---|---|---|
| 11,063,472 | B1 * | 7/2021 | Ashrafi | .................. | G06Q 50/06 |
| 11,176,289 | B2 * | 11/2021 | Abur | ....................... | G06F 17/16 |
| 2015/0105927 | A1 * | 4/2015 | Baone | ................... | H02J 3/0012 |
| | | | | | 700/292 |

| | | | | | |
|---|---|---|---|---|---|
| 2015/0213171 | A1 * | 7/2015 | Gullapalli | ............. | G06F 30/367 |
| | | | | | 703/14 |
| 2016/0036225 | A1 * | 2/2016 | Zhao | ......................... | H02J 3/00 |
| | | | | | 700/286 |
| 2020/0326363 | A1 * | 10/2020 | Sun | ....................... | H02H 1/0092 |
| 2020/0327264 | A1 * | 10/2020 | Wang | ....................... | H02J 3/008 |
| 2021/0175715 | A1 * | 6/2021 | Shukla | ....................... | H02J 3/06 |
| 2022/0229099 | A1 * | 7/2022 | Pradhan | ............... | H02H 1/0007 |

(Continued)

FOREIGN PATENT DOCUMENTS

| | | | | | |
|---|---|---|---|---|---|
| CN | 112231926 | A | * | 1/2021 | ............. G06F 30/20 |

OTHER PUBLICATIONS

Porkar, et al. "Frequency-Dependent Network Equivalent for Electromagnetic Transient Studies by Vector Fitting", 2005/2006 IEEE/PES Transmission and Distribution Conference and Exhibition, Dallas, TX, USA, 2006, pp. 166-171, doi: 10.1109/TDC.2006.1668477 (Year: 2006).*

(Continued)

*Primary Examiner* — Catherine T. Rastovski
*Assistant Examiner* — Toni D Sauncy
(74) *Attorney, Agent, or Firm* — PROCOPIO, CORY, HARGREAVES & SAVITCH LLP

(57)　　　　　ABSTRACT

The calculation of impedances at different frequencies and under a variety of system conditions is computationally burdensome. Accordingly, disclosed embodiments generate a set of reduced bus matrices, retaining nodes of interest from a square bus matrix that models an electrical network, for a plurality of frequencies. This set of reduced bus matrices retains the computational fidelity of the square bus matrix by capturing the influences from removed buses. To evaluate variations in system conditions, change matrices may be generated and applied to the set of reduced bus matrices using matrix algebra.

17 Claims, 3 Drawing Sheets

(56)                    References Cited

U.S. PATENT DOCUMENTS

2023/0410228 A1* 12/2023 Holzer .................. G06Q 50/06

OTHER PUBLICATIONS

Stevenson, Elements of Power System Analysis, (Text) McGraw-Hill Electrical and Electronic Engineering Series, (c) 1962, ISBN 07-61272-x, Access available online at Internet Archive (book checkout) Library URL: https://archive.org/details/elementsofpowers02stev/ ;Access Info-full book not provided (Year: 1962).*

Revoredo, et al., "Fast impedance matrix calculation for real-time application", Electric Power Systems Research, 211 (2022) 108194, Available online Jun. 21, 2022, 0378-7796; Published by Elsevier, open accesshttp://creativecommons.org/license (Year: 2022).*

Say, et al. "Chapter 3—Network Analysis", Electrical Engineer's Reference Book</i> (Sixteenth Edition), pp. 3-1 to 3-44, 2003. (Year: 2003).*

Syrandis, "Control techniques and the modeling of electrical power flow across transmission networks", Renewable and Sustainable Energy Reviews 82 (2018) 3452-3467, https://doi.org/10.1016/j.rser.2017.10.110 online Nov. 14, 2017 (Year: 2018).*

Rao, "Computation of the bus admittance matrix of networks having mutually coupled elements", Electrical Power and Energy Systems 28 (2006) 306-308 (Year: 2006).*

Nasiruzzaman, et al. "Bus dependency matrix of electrical power systems", Electrical Power and Energy Systems 56 (2014) 33-41 (Year: 2014).*

Gao (CN112231926A) Translation Used for Examination (Year: 2021).*

Saxena, et al., "A new approach to bus impedance matrix building", Computers and Electrical Engineering 29 (2003) 55-65. (Year: 2003).*

Stevenson Jr., "Elements of Power System Analysis", 4th edition, McGraw-Hill Publishing Company, McGraw-Hill Electrical and Electronic Engineering Series, New York, 1982, ISBN 0-07-061278-1, 380 pages.

* cited by examiner

METHOD FOR FAST CALCULATION OF ELECTRICAL NETWORK IMPEDANCES AT MANY FREQUENCIES AND MANY SYSTEM CONDITIONS

BACKGROUND

Field of the Invention

The embodiments described herein are generally directed to the calculation of impedances in an electrical network, and, more particularly, to fast calculation of impedances in an electric network at a plurality of frequencies and/or under a plurality of system conditions.

Description of the Related Art

In circuit analysis of an electrical network, it is necessary to determine the network impedance at specific nodes in the electrical network. Typically, the impedances are calculated using classical matrix-based, power-system analysis.

However, the impedances often need to be determined across a range of frequencies and/or under a variety of system conditions. Thus, given the frequency-dependent nature of each electrical component in the electrical network, impedance calculations must be performed across a range of frequencies and for each variation in the system conditions.

For large electrical networks, it is computationally burdensome to calculate the network impedance at a specific node for the entire range of frequencies. Furthermore, all of the variations in the system conditions that are to be analyzed, such as various topologies of the electrical network (e.g., different combinations of electrical components being in service or out of service), must be individually set up. This can be complicated, and therefore, imposes an additional significant burden.

Traditional methods for reducing the computational burden have generally focused on simplifying the representation of the electrical network by reducing the extent of the electrical network that is explicitly analyzed. For example, PRC Application No. CN112231926 A, filed on Oct. 29, 2020, provides an example of network reduction. However, such simplification results in uncertainty as to whether a sufficient portion of the electrical network has been retained and/or whether there is sufficient equivalence between the simplified representation and the actual electrical network to ensure that the results are suitably accurate. If the extent of the electrical network is reduced too much, the influence of the frequency-dependent nature of the eliminated portions of the electrical network may be lost.

One approach for simplifying the representation of the electrical network is to use frequency-dependent network-equivalent circuits at the boundary nodes, where portions of the electrical network have been eliminated. However, extensive effort is required to ensure that these network-equivalent circuits correctly represent the frequency-dependent behavior of the eliminated portions of the electrical network. In addition, impedances must still be calculated for these network-equivalent circuits.

Another approach is to model an extent of the electrical network, perform impedance calculations firstly with the boundary nodes short-circuited, and secondly with the boundary nodes open-circuited. If the differences in these impedance calculations are acceptably small, then the modeled extent is considered sufficient. Otherwise, the modeled extent is considered insufficient. However, for every change in the topology of the electrical network, the modeled extent must be changed and the process repeated. Thus, setting up variations in the network topology or other system conditions may require significant effort, especially if there are many variations to be considered.

SUMMARY

Accordingly, systems, methods, and non-transitory computer-readable media are disclosed for fast calculation of impedances in an electric network at a plurality of frequencies and/or under a plurality of system conditions. An objective of certain embodiments is to reduce the computational burden of calculating impedances at a plurality of frequencies and/or under a plurality of system conditions, while also reducing or eliminating uncertainties. A further objective of certain embodiments is to improve evaluation times for analyzing an electrical network with a variety of network topologies.

In an embodiment, a method comprises using at least one hardware processor to: for each of a plurality of frequencies, acquire a square bus matrix for the frequency, wherein the square bus matrix comprises a row and a column corresponding to each of a plurality of buses within an electrical network of a power system, wherein each location on a diagonal of the square bus matrix represents a sum of parameter values of all electrical components of the electrical network that are connected to one of the plurality buses corresponding to both the row and the column, and wherein each location off the diagonal of the square bus matrix represents a parameter value between one of the plurality of buses corresponding to the row and one of the plurality of buses corresponding to the column, generate a reduced bus matrix for the frequency from the square bus matrix for the frequency, and add the reduced bus matrix to a set of reduced bus matrices for the plurality of frequencies, wherein each reduced bus matrix has a same size; generate a change matrix that is the same size as each reduced bus matrix, wherein the change matrix comprises a zero value at all locations not being changed; and apply the change matrix to each reduced bus matrix in the set of reduced bus matrices to produce a set of variation bus matrices. Each parameter value may be an admittance value. Alternatively, each parameter value may be an impedance value. Applying the change matrix comprises adding or subtracting the change matrix.

Generating a reduced bus matrix for the frequency from the square bus matrix may comprise removing one or more of the plurality of buses, while updating the parameter values for retained ones of the plurality of buses based on an influence from the removed one or more buses. Generating a reduced bus matrix for the frequency from the square bus matrix may comprise: partitioning the square bus matrix into $$\begin{bmatrix} K & L \\ L^T & M \end{bmatrix}$$

wherein K comprises the parameter values for the retained ones of the plurality of buses, M comprises the parameter values for the removed one or more buses, L comprises the parameter values between one of the retained one of the plurality of buses and one of the removed one or more buses, and $L^T$ is a transpose of L; and computing the reduced bus matrix as $K - LM^{-1}L^T$.

The method may further comprise using the at least one hardware processor to perform circuit analysis based on the set of variation bus matrices. The circuit analysis may comprise computing a voltage for each of the plurality of buses in each variation bus matrix in the set of variation bus matrices based on one or more injected currents. For example, the circuit analysis may comprise computing a voltage for each of the plurality of buses in each variation bus matrix in the set of variation bus matrices according to:

$$V = Y_{variation}^{-1} I$$

wherein V is a vector of voltages, $$Y_{variation}^{-1}$$

is an inverse of the variation bus matrix, and I is a vector of injected currents, and wherein each parameter value is an admittance value. The method may further comprise using the at least one hardware processor to initiate control of at least one of the electrical components of the electrical network based on the circuit analysis.

The method may further comprise using the at least one hardware processor to: generate the change matrix for each of a plurality of changed system conditions; and for each of the plurality of changed system conditions, apply the change matrix generated for that changed system condition to each reduced bus matrix in the set of reduced bus matrices to produce a set of variation bus matrices for that changed system condition for the plurality of frequencies. Each of the plurality of changed system conditions may represent a different topology in the electrical network than at least one other one of the plurality of changed system conditions.

It should be understood that any of the features in the methods above may be implemented individually or with any subset of the other features in any combination. Thus, to the extent that the appended claims would suggest particular dependencies between features, disclosed embodiments are not limited to these particular dependencies. Rather, any of the features described herein may be combined with any other feature described herein, or implemented without any one or more other features described herein, in any combination of features whatsoever. In addition, any of the methods, described above and elsewhere herein, may be embodied, individually or in any combination, in executable software modules of a processor-based system, such as a server, and/or in executable instructions stored in a non-transitory computer-readable medium.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

In an embodiment, systems, methods, and non-transitory computer-readable media are disclosed for fast calculation of impedances in an electric network at a plurality of frequencies and/or under a plurality of system conditions. After reading this description, it will become apparent to one skilled in the art how to implement the invention in various alternative embodiments and alternative applications. However, although various embodiments of the present invention will be described herein, it is understood that these embodiments are presented by way of example and illustration only, and not limitation. As such, this detailed description of various embodiments should not be construed to limit the scope or breadth of the present invention as set forth in the appended claims.

1. Example Infrastructure

Figure 1:
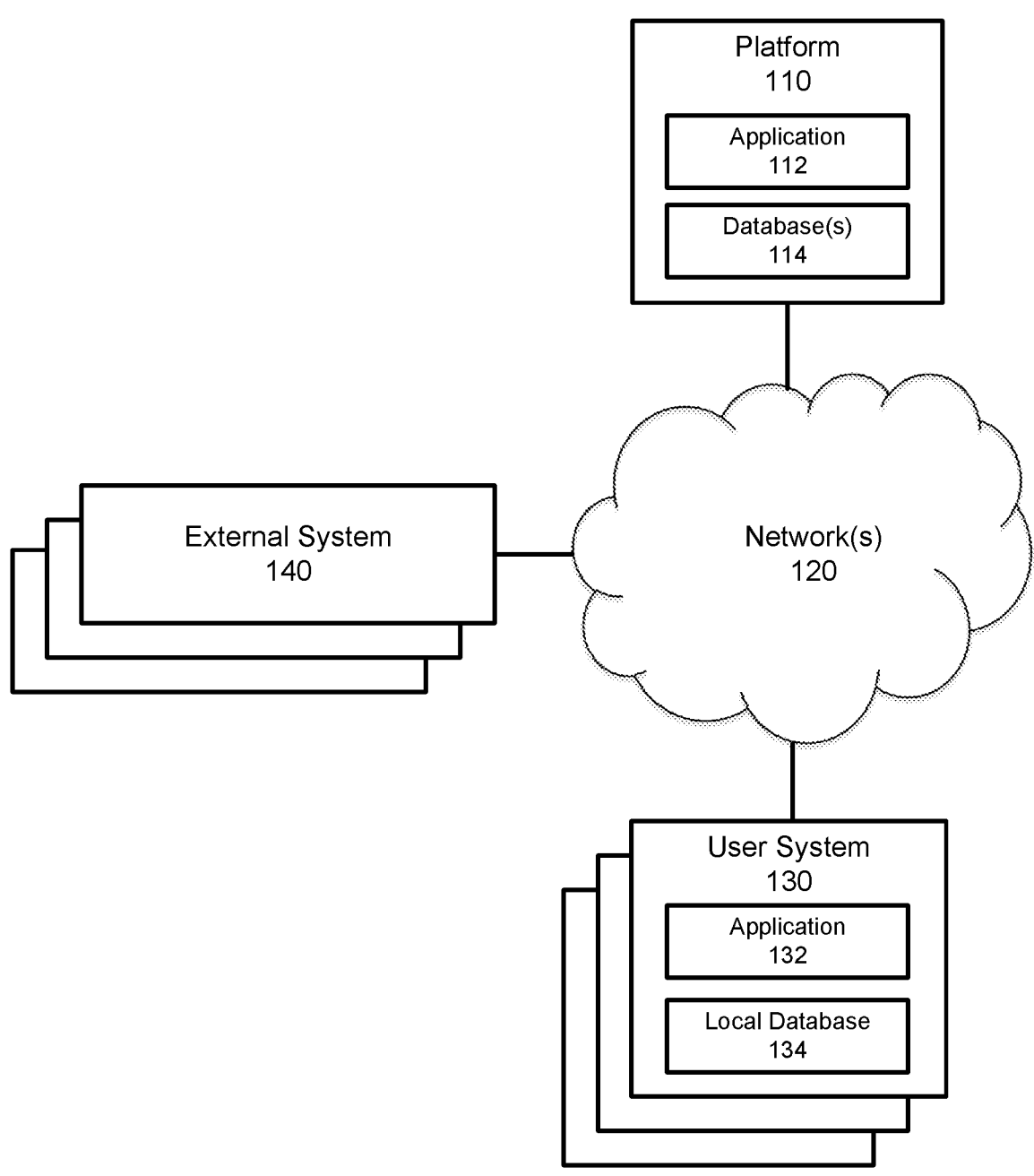
FIG. 1 illustrates an example infrastructure, in which one or more of the processes described herein, may be implemented, according to an embodiment.

FIG. 1 illustrates an example infrastructure in which one or more of the disclosed processes may be implemented, according to an embodiment. The infrastructure may comprise a platform 110 (e.g., one or more servers) which hosts and/or executes one or more of the various processes, methods, functions, and/or software modules described herein. Platform 110 may comprise dedicated servers, or may instead be implemented in a computing cloud, in which the resources of one or more servers are dynamically and elastically allocated to multiple tenants based on demand. In either case, the servers may be collocated and/or geographically distributed. Platform 110 may also comprise or be communicatively connected to a server application 112 and/or one or more databases 114. In addition, platform 110 may be communicatively connected to one or more user systems 130 via one or more networks 120. Platform 110 may also be communicatively connected to one or more external systems 140 (e.g., other platforms, energy management systems or other control systems of a power system, etc.) via one or more networks 120.

Network(s) 120 may comprise the Internet, and platform 110 may communicate with user system(s) 130 through the Internet using standard transmission protocols, such as HyperText Transfer Protocol (HTTP), HTTP Secure (HTTPS), File Transfer Protocol (FTP), FTP Secure (FTPS), Secure Shell FTP (SFTP), and the like, as well as proprietary protocols. While platform 110 is illustrated as being connected to various systems through a single set of network(s) 120, it should be understood that platform 110 may be connected to the various systems via different sets of one or more networks. For example, platform 110 may be connected to a subset of user systems 130 and/or external systems 140 via the Internet, but may be connected to one or more other user systems 130 and/or external systems 140 via an intranet. Furthermore, while only a few user systems 130 and external systems 140, one server application 112, and one set of database(s) 114 are illustrated, it should be understood that the infrastructure may comprise any number of user systems, external systems, server applications, and databases.

User system(s) 130 may comprise any type or types of computing devices capable of wired and/or wireless communication, including without limitation, desktop computers, laptop computers, tablet computers, smart phones or other mobile phones, servers, game consoles, televisions, set-top boxes, electronic kiosks, point-of-sale terminals, and/or the like. However, it is generally contemplated that a user system 130 would be the personal computer or professional workstation of a user responsible for managing a power system. Each user system 130 may comprise or be communicatively connected to a client application 132 and/or one or more local databases 134.

External system(s) 140 may also comprise any type or types of computing devices capable of wired and/or wireless communication. However, it is generally contemplated that an external system would be the control system of the electrical network of a power system. This control system may be an energy management system (EMS), supervisory control and data acquisition (SCADA) system, and/or the like. In this case, external system 140 may collect and/or derive data from one or a plurality of sensors in the electrical network (e.g., voltage and current measurements, states of electrical components, etc.) and/or control one or more electrical components in the electrical network.

Platform 110 may comprise web servers which host one or more websites and/or web services. In embodiments in which a website is provided, the website may comprise a graphical user interface, including, for example, one or more screens (e.g., webpages) generated in HyperText Markup Language (HTML) or other language. Platform 110 transmits or serves one or more screens of the graphical user interface in response to requests from user system(s) 130. In some embodiments, these screens may be served in the form of a wizard, in which case two or more screens may be served in a sequential manner, and one or more of the sequential screens may depend on an interaction of the user or user system 130 with one or more preceding screens. The requests to platform 110 and the responses from platform 110, including the screens of the graphical user interface, may both be communicated through network(s) 120, which may include the Internet, using standard communication protocols (e.g., HTTP, HTTPS, etc.). These screens (e.g., webpages) may comprise a combination of content and elements, such as text, images, videos, animations, references (e.g., hyperlinks), frames, inputs (e.g., textboxes, text areas, checkboxes, radio buttons, drop-down menus, buttons, forms, etc.), scripts (e.g., JavaScript), and the like, including elements comprising or derived from data stored in one or more databases (e.g., database(s) 114) that are locally and/or remotely accessible to platform 110. It should be understood that platform 110 may also respond to other requests from user system(s) 130.

Platform 110 may comprise, be communicatively coupled with, or otherwise have access to one or more database(s) 114. For example, platform 110 may comprise one or more database servers which manage one or more databases 114. Server application 112 executing on platform 110 and/or client application 132 executing on user system 130 may submit data (e.g., user data, form data, etc.) to be stored in database(s) 114, and/or request access to data stored in database(s) 114. Any suitable database may be utilized, including without limitation MySQL™, Oracle™, IBM™, Microsoft SQL™, Access™, PostgreSQL™, MongoDB™, and the like, including cloud-based databases and proprietary databases. Data may be sent to platform 110, for instance, using the well-known POST request supported by HTTP, via FTP, and/or the like. This data, as well as other requests, may be handled, for example, by server-side web technology, such as a servlet or other software module (e.g., comprised in server application 112), executed by platform 110.

In embodiments in which a web service is provided, platform 110 may receive requests from user system(s) 130 and/or external system(s) 140, and provide responses in extensible Markup Language (XML), JavaScript Object Notation (JSON), and/or any other suitable or desired format. In such embodiments, platform 110 may provide an application programming interface (API) which defines the manner in which user system(s) 130 and/or external system (s) 140 may interact with the web service. Thus, user system(s) 130 and/or external system(s) 140 (which may themselves be servers), can define their own user interfaces, and rely on the web service to implement or otherwise provide the backend processes, methods, functionality, storage, and/or the like, described herein. For example, in such an embodiment, a client application 132, executing on one or more user system(s) 130, may interact with a server application 112 executing on platform 110 to execute one or more or a portion of one or more of the various functions, processes, methods, and/or software modules described herein.

Client application 132 may be "thin," in which case processing is primarily carried out server-side by server application 112 on platform 110. A basic example of a thin client application 132 is a browser application, which simply requests, receives, and renders webpages at user system(s) 130, while server application 112 on platform 110 is responsible for generating the webpages and managing database functions. Alternatively, the client application may be "thick," in which case processing is primarily carried out client-side by user system(s) 130. It should be understood that client application 132 may perform an amount of processing, relative to server application 112 on platform 110, at any point along this spectrum between "thin" and "thick," depending on the design goals of the particular implementation. In any case, the software described herein, which may wholly reside on either platform 110 (e.g., in which case server application 112 performs all processing) or user system(s) 130 (e.g., in which case client application 132 performs all processing) or be distributed between platform 110 and user system(s) 130 (e.g., in which case server application 112 and client application 132 both perform processing), can comprise one or more executable software modules comprising instructions that implement one or more of the processes, methods, or functions described herein.

2. Example Processing Device

Figure 2:
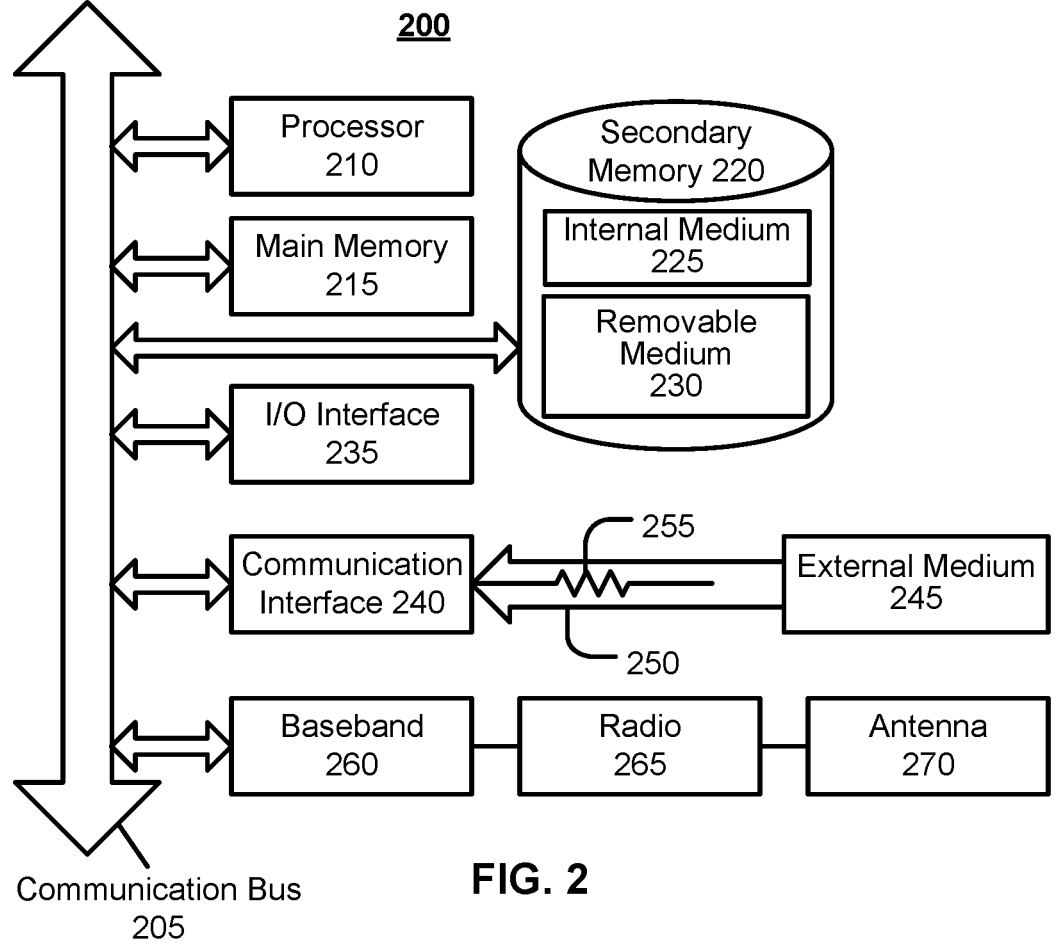
FIG. 2 illustrates an example processing system, by which one or more of the processes described herein, may be executed, according to an embodiment.

FIG. 2 is a block diagram illustrating an example wired or wireless system 200 that may be used in connection with various embodiments described herein. For example, system 200 may be used as or in conjunction with one or more of the functions, processes, or methods (e.g., to store and/or execute the software) described herein, and may represent components of platform 110, user system(s) 130, external system(s) 140, and/or other processing devices described herein. System 200 can be a server or any conventional personal computer, or any other processor-enabled device that is capable of wired or wireless data communication. Other computer systems and/or architectures may be also used, as will be clear to those skilled in the art.

System 200 preferably includes one or more processors 210. Processor(s) 210 may comprise a central processing unit (CPU). Additional processors may be provided, such as a graphics processing unit (GPU), an auxiliary processor to manage input/output, an auxiliary processor to perform floating-point mathematical operations, a special-purpose microprocessor having an architecture suitable for fast execution of signal-processing algorithms (e.g., digital-signal processor), a slave processor subordinate to the main processing system (e.g., back-end processor), an additional microprocessor or controller for dual or multiple processor systems, and/or a coprocessor. Such auxiliary processors may be discrete processors or may be integrated with processor 210. Examples of processors which may be used with system 200 include, without limitation, any of the processors (e.g., Pentium™, Core i7™, Xeon™, etc.) available from Intel Corporation of Santa Clara, California, any of the processors available from Advanced Micro Devices, Incorporated (AMD) of Santa Clara, California, any of the processors (e.g., A series, M series, etc.) available from Apple Inc. of Cupertino, any of the processors (e.g., Exynos™) available from Samsung Electronics Co., Ltd., of Seoul, South Korea, any of the processors available from NXP Semiconductors N.V. of Eindhoven, Netherlands, and/or the like.

Processor 210 is preferably connected to a communication bus 205. Communication bus 205 may include a data channel for facilitating information transfer between storage and other peripheral components of system 200. Furthermore, communication bus 205 may provide a set of signals used for communication with processor 210, including a data bus, address bus, and/or control bus (not shown). Communication bus 205 may comprise any standard or non-standard bus architecture such as, for example, bus architectures compliant with industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and/or the like.

System 200 preferably includes a main memory 215 and may also include a secondary memory 220. Main memory 215 provides storage of instructions and data for programs executing on processor 210, such as any of the software discussed herein. It should be understood that programs stored in the memory and executed by processor 210 may be written and/or compiled according to any suitable language, including without limitation C/C++, Java, JavaScript, Perl, Visual Basic, .NET, and the like. Main memory 215 is typically semiconductor-based memory such as dynamic random access memory (DRAM) and/or static random access memory (SRAM). Other semiconductor-based memory types include, for example, synchronous dynamic random access memory (SDRAM), Rambus dynamic random access memory (RDRAM), ferroelectric random access memory (FRAM), and the like, including read only memory (ROM).

Secondary memory 220 is a non-transitory computer-readable medium having computer-executable code (e.g., any of the software disclosed herein) and/or other data stored thereon. The computer software or data stored on secondary memory 220 is read into main memory 215 for execution by processor 210. Secondary memory 220 may include, for example, semiconductor-based memory, such as programmable read-only memory (PROM), erasable programmable read-only memory (EPROM), electrically erasable read-only memory (EEPROM), and flash memory (block-oriented memory similar to EEPROM).

Secondary memory 220 may optionally include an internal medium 225 and/or a removable medium 230. Removable medium 230 is read from and/or written to in any well-known manner. Removable storage medium 230 may be, for example, a magnetic tape drive, a compact disc (CD) drive, a digital versatile disc (DVD) drive, other optical drive, a flash memory drive, and/or the like.

In alternative embodiments, secondary memory 220 may include other similar means for allowing computer programs or other data or instructions to be loaded into system 200. Such means may include, for example, a communication interface 240, which allows software and data to be transferred from external storage medium 245 to system 200. Examples of external storage medium 245 include an external hard disk drive, an external optical drive, an external magneto-optical drive, and/or the like.

As mentioned above, system 200 may include a communication interface 240. Communication interface 240 allows software and data to be transferred between system 200 and external devices (e.g. printers), networks, or other information sources. For example, computer software or executable code may be transferred to system 200 from a network server (e.g., platform 110) via communication interface 240. Examples of communication interface 240 include a built-in network adapter, network interface card (NIC), Personal Computer Memory Card International Association (PCMCIA) network card, card bus network adapter, wireless network adapter, Universal Serial Bus (USB) network adapter, modem, a wireless data card, a communications port, an infrared interface, an IEEE 1394 fire-wire, and any other device capable of interfacing system 200 with a network (e.g., network(s) 120) or another computing device. Communication interface 240 preferably implements industry-promulgated protocol standards, such as Ethernet IEEE 802 standards, Fiber Channel, digital subscriber line (DSL), asynchronous digital subscriber line (ADSL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on, but may also implement customized or non-standard interface protocols as well.

Software and data transferred via communication interface 240 are generally in the form of electrical communication signals 255. These signals 255 may be provided to communication interface 240 via a communication channel 250. In an embodiment, communication channel 250 may be a wired or wireless network (e.g., network(s) 120), or any variety of other communication links. Communication channel 250 carries signals 255 and can be implemented using a variety of wired or wireless communication means including wire or cable, fiber optics, conventional phone line, cellular phone link, wireless data communication link, radio frequency ("RF") link, or infrared link, just to name a few.

Computer-executable code (e.g., computer programs, such as the disclosed software) is stored in main memory 215 and/or secondary memory 220. Computer-executable code can also be received via communication interface 240 and stored in main memory 215 and/or secondary memory 220. Such computer programs, when executed, enable system 200 to perform the various functions of the disclosed embodiments as described elsewhere herein.

In this description, the term "computer-readable medium" is used to refer to any non-transitory computer-readable storage media used to provide computer-executable code and/or other data to or within system 200. Examples of such media include main memory 215, secondary memory 220

(including internal memory 225 and/or removable medium 230), external storage medium 245, and any peripheral device communicatively coupled with communication interface 240 (including a network information server or other network device). These non-transitory computer-readable media are means for providing software and/or other data to system 200.

In an embodiment that is implemented using software, the software may be stored on a computer-readable medium and loaded into system 200 by way of removable medium 230, I/O interface 235, or communication interface 240. In such an embodiment, the software is loaded into system 200 in the form of electrical communication signals 255. The software, when executed by processor 210, preferably causes processor 210 to perform one or more of the processes and functions described elsewhere herein.

In an embodiment, I/O interface 235 provides an interface between one or more components of system 200 and one or more input and/or output devices. Example input devices include, without limitation, sensors, keyboards, touch screens or other touch-sensitive devices, cameras, biometric sensing devices, computer mice, trackballs, pen-based pointing devices, and/or the like. Examples of output devices include, without limitation, other processing devices, cathode ray tubes (CRTs), plasma displays, light-emitting diode (LED) displays, liquid crystal displays (LCDs), printers, vacuum fluorescent displays (VFDs), surface-conduction electron-emitter displays (SEDs), field emission displays (FEDs), and/or the like. In some cases, an input and output device may be combined, such as in the case of a touch panel display (e.g., in a smartphone, tablet, or other mobile device).

System 200 may also include optional wireless communication components that facilitate wireless communication over a voice network and/or a data network (e.g., in the case of user system 130). The wireless communication components comprise an antenna system 270, a radio system 265, and a baseband system 260. In system 200, radio frequency (RF) signals are transmitted and received over the air by antenna system 270 under the management of radio system 265.

In an embodiment, antenna system 270 may comprise one or more antennae and one or more multiplexors (not shown) that perform a switching function to provide antenna system 270 with transmit and receive signal paths. In the receive path, received RF signals can be coupled from a multiplexor to a low noise amplifier (not shown) that amplifies the received RF signal and sends the amplified signal to radio system 265.

In an alternative embodiment, radio system 265 may comprise one or more radios that are configured to communicate over various frequencies. In an embodiment, radio system 265 may combine a demodulator (not shown) and modulator (not shown) in one integrated circuit (IC). The demodulator and modulator can also be separate components. In the incoming path, the demodulator strips away the RF carrier signal leaving a baseband receive audio signal, which is sent from radio system 265 to baseband system 260.

If the received signal contains audio information, then baseband system 260 decodes the signal and converts it to an analog signal. Then the signal is amplified and sent to a speaker. Baseband system 260 also receives analog audio signals from a microphone. These analog audio signals are converted to digital signals and encoded by baseband system 260. Baseband system 260 also encodes the digital signals for transmission and generates a baseband transmit audio signal that is routed to the modulator portion of radio system 265. The modulator mixes the baseband transmit audio signal with an RF carrier signal, generating an RF transmit signal that is routed to antenna system 270 and may pass through a power amplifier (not shown). The power amplifier amplifies the RF transmit signal and routes it to antenna system 270, where the signal is switched to the antenna port for transmission.

Baseband system 260 is also communicatively coupled with processor(s) 210. Processor(s) 210 may have access to data storage areas 215 and 220. Processor(s) 210 are preferably configured to execute instructions (i.e., computer programs, such as the disclosed software) that can be stored in main memory 215 or secondary memory 220. Computer programs can also be received from baseband processor 260 and stored in main memory 210 or in secondary memory 220, or executed upon receipt. Such computer programs, when executed, can enable system 200 to perform the various functions of the disclosed embodiments.

3. Process Overview

Figure 3:
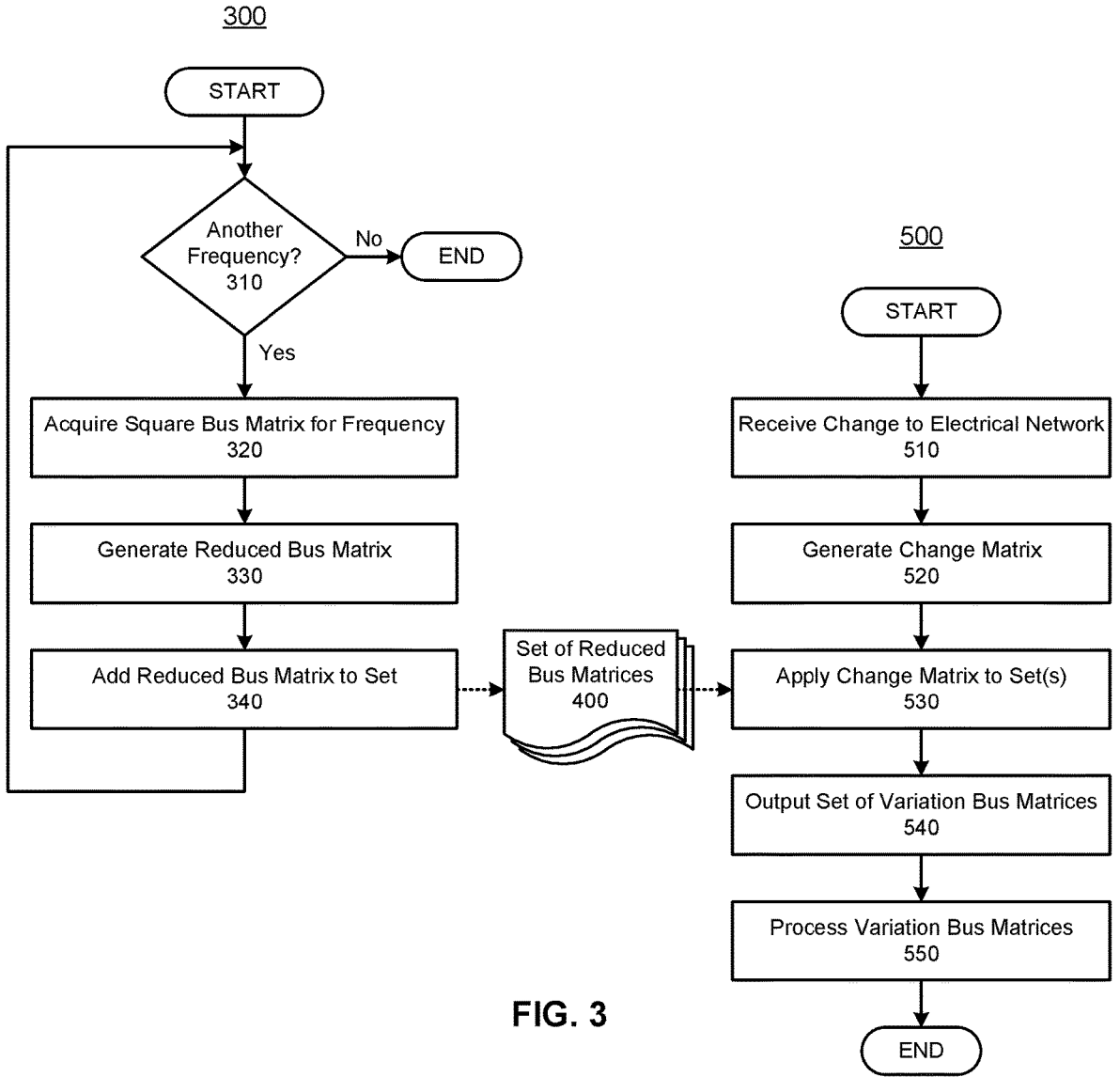
FIG. 3 illustrates processes for fast calculation of impedances in an electrical network at a plurality of frequencies and/or under a plurality of system conditions, according to an embodiment.

FIG. 3 illustrates parallel processes 300 and 500 for fast calculation of impedances in an electric network at a plurality of frequencies and/or under a plurality of system conditions, according to an embodiment. It should be understood that processes 300 and 500 may be embodied in one or more software modules that are executed by one or more hardware processors (e.g., processor 210), for example, as a software application (e.g., server application 112, client application 132, and/or a distributed application comprising both server application 112 and client application 132), which may be executed wholly by processor(s) of platform 110, wholly by processor(s) of user system(s) 130, or may be distributed across platform 110 and user system(s) 130, such that some portions or modules of the software application are executed by platform 110 and other portions or modules of the software application are executed by user system(s) 130. Processes 300 and 500 may be implemented as instructions represented in source code, object code, and/or machine code. These instructions may be executed directly by hardware processor(s) 210, or alternatively, may be executed by a virtual machine operating between the object code and hardware processor(s) 210. In addition, the disclosed software may be built upon or interfaced with one or more existing systems.

Alternatively, the described processes may be implemented as a hardware component (e.g., general-purpose processor, integrated circuit (IC), application-specific integrated circuit (ASIC), digital signal processor (DSP), field-programmable gate array (FPGA) or other programmable logic device, discrete gate or transistor logic, etc.), combination of hardware components, or combination of hardware and software components. To clearly illustrate the interchangeability of hardware and software, various illustrative components, blocks, modules, circuits, and steps are described herein generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the invention. In addition, the grouping of functions within a component, block, module, circuit, or step is for ease of description. Specific functions or steps can be moved from one component, block, module, circuit, or step to another without departing from the invention.

While processes 300 and 500 are illustrated with a certain arrangement and ordering of subprocesses, each process may be implemented with fewer, more, or different subprocesses and a different arrangement and/or ordering of subprocesses. In addition, it should be understood that any subprocess, which does not depend on the completion of another subprocess, may be executed before, after, or in parallel with that other independent subprocess, even if the subprocesses are described or illustrated in a particular order.

Starting with process 300, subprocess 310 determines whether or not another frequency is to be modeled. When another frequency is to be modeled (i.e., "Yes" in subprocess 310), process 300 proceeds to subprocess 320. Otherwise, when no more frequencies remain to be modeled (i.e., "No" in subprocess 310), process 300 may end. In other words, subprocess 310 forms a loop that iterates over each frequency to be modeled.

The set of frequencies to be modeled may be determined by a user (e.g., logged into server application 112), but will generally be dictated by the electrical network. For example, the set of frequencies will generally include the normal operating frequency of the electrical network. In some cases, only one frequency may be modeled, representing, for example, the normal operating frequency. In other cases, a plurality of frequencies may be modeled, such as a range of frequencies around the normal operating frequency. In this case, each of the plurality of frequencies (e.g., in the range of frequencies) may be selected for one iteration of the loop formed by subprocesses 310-340.

In subprocess 320, a square bus matrix is acquired for the current frequency under consideration. Acquiring the square bus matrix may comprise generating the square bus matrix from a specification of the electrical network. Alternatively, the square bus matrix for each frequency may be predefined. In this case, acquiring the square bus matrix may comprise retrieving the predefined square bus matrix for the current frequency from database(s) 114.

In general, the square bus matrix will comprise a row and a column corresponding to each of a plurality of buses within the electrical network. Each location on a diagonal of the square bus matrix represents a sum of parameter values of all electrical components of the electrical network that are connected to one of the plurality buses corresponding to both the row and the column. Each location off the diagonal of the square bus matrix represents a parameter value between one of the plurality of buses corresponding to the row and one of the plurality of buses corresponding to the column. In an embodiment, each parameter value is an admittance value. In an alternative embodiment, each parameter value is an impedance value.

For power system analysis, the topology of the electrical network is generally represented by a square admittance matrix, denoted $Y_{bus}$. Such an approach is described in detail in "Elements of Power System Analysis," by Stevenson, Jr., 4th ed., McGraw-Hill Book Co., New York, 1982, ISBN 0-07-061278-1 ("Stevenson"), which is hereby incorporated herein by reference as if set forth in full. When developing the admittance matrix $Y_{bus}$, the nodes or "buses" of the electrical network are each assigned a unique bus number, beginning at one and increasing by one for each additional bus.

The bus number represents a position along the diagonal of the admittance matrix $Y_{bus}$. For example, the location of Bus 3 in the admittance matrix $Y_{bus}$ would be (3, 3). The value stored in the admittance matrix $Y_{bus}$ for each bus (i.e., on the diagonal of the square bus matrix) represents the sum of the admittances of all electrical components connected to that bus. Each off-diagonal value in the admittance matrix $Y_{bus}$ is the negative of the sum of all electrical components between the pair of buses corresponding to the row and the column.

For example, admittance matrix $Y_{bus}$ for three buses may be expressed as:

$$Y_{bus} = \begin{bmatrix} Y_{1,1} & -Y_{1,2} & -Y_{1,3} \\ -Y_{2,1} & Y_{2,2} & -Y_{2,3} \\ -Y_{3,1} & -Y_{3,2} & Y_{3,3} \end{bmatrix}$$

wherein $Y_{i,i}$ is the sum of the admittances connected at Bus i, including admittances to ground and between Bus i and other buses, and $Y_{i,j}$ is the admittance between Bus i and Bus j. For example, $Y_{2,2}$ is the sum of admittances at Bus 2, and $Y_{2,1}$ is the admittance between Bus 2 and Bus 1. Electrical networks are symmetrical, such that $Y_{i,j}=Y_{j,i}$. For example, $Y_{2,1}=Y_{1,2}$. Each admittance value Y may be a complex number that includes a real part (i.e., conductance) and an imaginary part (i.e., susceptance).

The admittance matrix $Y_{bus}$ is one example of the square matrix that is acquired in subprocess 320. It should be understood that, in an embodiment that uses the admittance matrix $Y_{bus}$ as the square matrix, each parameter value is an admittance value. In an alternative embodiment, the impedance matrix $Z_{bus}$ may be used as the square matrix that is acquired in subprocess 300. In this case, each parameter value is an impedance value. For example, impedance matrix $Z_{bus}$ for three buses may be constructed for each frequency using the techniques outlined in Section 7.7 of Stevenson:

$$Z_{bus} = \begin{bmatrix} Z_{1,1} & Z_{1,2} & Z_{1,3} \\ Z_{2,1} & Z_{2,2} & Z_{2,3} \\ Z_{3,1} & Z_{3,2} & Z_{3,3} \end{bmatrix}$$

wherein $Z_{i,i}$ is the "self" impedance at Bus i, and $Z_{i,j}$ is the total effective "transfer" impedance of the electrical network between Bus i and Bus j. If an impedance value Z represents the complex impedance of an electrical component of the electrical network, with the real value representing the electrical component's resistance and the imaginary value representing the electrical component's reactance, then $Y_{bus}$ is the inverse of $Z_{bus}$ (i.e., $Y_{bus}=Z_{bus}^{-1}$). Thus, it is simple to convert from admittance matrix to the impedance matrix, and vice versa. For the sake of simplicity, embodiments will be primarily described herein with respect to the admittance matrix $Y_{bus}$. However, it should be understood that alternative embodiments may utilize the impedance matrix $Z_{bus}$ with appropriate conversions and modifications.

In subprocess 330, a reduced bus matrix is generated from the square bus matrix (e.g., $Y_{bus}$) that was acquired in subprocess 320. For large electrical networks (e.g., with a large number of buses), the square bus matrix may become quite large, which increases the computational burden of matrix operations. Thus, in an embodiment, node elimination is used to reduce the size of the square bus matrix to only those buses that are of interest (e.g., for a particular analysis). In other words, the bus matrix may be reduced to the minimum size required for appropriate analysis. The buses of interest that are retained in the reduced bus matrix may comprise or consist of those buses which may potentially be changed during circuit analysis.

An embodiment of node elimination is disclosed in Chapter 7.4 (pages 174-178) of Stevenson. In Stevenson, node elimination is used for the fundamental frequency of the system. However, the inventor has recognized that the same technique can be used for any frequency for which a square bus matrix has been developed.

Thus, in an embodiment, subprocess 330 comprises partitioning the admittance matrix $Y_{bus}$ for the current frequency f into four units:

$$Y_{bus}(f) = \begin{bmatrix} K & L \\ L^T & M \end{bmatrix}$$

wherein K comprises the parameter values (i.e., admittance values) for the retained bus(es), M comprises the parameter values for the removed bus(es), L comprises the parameter values between retained ones of the plurality of buses and removed ones of the plurality of buses, and $L^T$ is the transpose of L. In other words, all of the buses of interest are numbered with the lowest bus numbers, such that they are all in K, whereas the buses to be removed are numbered with the highest bus numbers, such that that they are all in M.

After partitioning the square bus matrix, subprocess 330 may compute the reduced bus matrix as:

$$K - LM^{-1}L^T$$

For example, the reduced admittance matrix $Y_{reduced}$ for the current frequency f may be calculated as:

$$Y_{reduced}(f) = K - LM^{-1}L^T$$

The resulting reduced bus matrix captures the influences on the retained nodes of the admittances from all other buses, including the removed buses. In other words, the reduced bus matrix for a frequency is generated by removing one or more buses from the square bus matrix, while updating the parameter values for retained buses in the reduced bus matrix based on the influence from the removed bus(es). It should be understood that each reduced bus matrix generated in subprocess 330 will be square, but will be smaller than the square bus matrix acquired in subprocess 320.

In subprocess 340, the reduced bus matrix, generated in subprocess 330, is added to a set 400 of reduced bus matrices. Then, process 300 may return to subprocess 310 to determine whether or not another frequency remains to be modeled. Set 400 of reduced bus matrices may be stored in memory for future retrieval. For example, a representation of each reduced bus matrix in set 400 may be stored in database(s) 114 (e.g., a relational database), and indexed for fast retrieval (e.g., collectively as a set 400 and/or individually) from database(s) 114.

It should be understood that, over a plurality of iterations of the loop formed by subprocess 310-340, set 400 of reduced bus matrices will accumulate a reduced bus matrix for each frequency that has been considered. Thus, set 400 may comprise a plurality of reduced bus matrices, representing models of the electrical network for a plurality of frequencies (e.g., range of frequencies including the normal operating frequency). In other words, each reduced bus matrix in set 400 represents a model, of the electrical network at a given frequency, which is less computationally burdensome that the original square bus matrix from which it was derived. Each reduced bus matrix in set 400 may have the same size, but this is not a requirement of any embodiment.

Turning to process 500, subprocess 510 receives a change to the electrical network. The change may be a user-specified change. For example, a user (e.g., logged into server application 112) may input a change to a system condition of the electrical network via a graphical user interface generated by server application 112. Alternatively, the change may be specified by software, such as analytic software within server application 112, external to server application 112 and hosted on platform 110, or external to server application 112 and hosted on an external system 140 that communicates with platform 110 (e.g., via an API of platform 110). In this case, process 500 may be a service (e.g., microservice) that can be used to derive variation bus matrices for use in analysis (e.g., circuit analysis).

In subprocess 520, a change matrix is generated based on the change to the electrical network, received in subprocess 510. The change matrix is the same size as the reduced bus matrices in set 400, and may comprise changes to any of the buses that were retained in K. The change matrix may be generated by determining the difference in the parameter value (e.g., admittance value) at each location in the reduced bus matrices in set 400, and placing the value of that difference at the corresponding location in the change matrix. It should be understood that this value will be zero at locations in the change matrix at which a change does not occur. For example, assume a reduced bus matrix for frequency f of:

$$Y_{reduced}(f) = \begin{bmatrix} Y_{1,1} & -Y_{1,2} & -Y_{1,3} \\ -Y_{2,1} & Y_{2,2} & -Y_{2,3} \\ -Y_{3,1} & -Y_{3,2} & Y_{3,3} \end{bmatrix}$$

In this case, the change matrix $Y_\Delta$ for frequency f would be:

$$Y_\Delta(f) = \begin{bmatrix} \Delta Y_{1,1} & \Delta Y_{1,2} & \Delta Y_{1,3} \\ \Delta Y_{2,1} & \Delta Y_{2,2} & \Delta Y_{2,3} \\ \Delta Y_{3,1} & \Delta Y_{3,2} & \Delta Y_{3,3} \end{bmatrix}$$

Thus, the change matrix $Y_\Delta$ for frequency f represents the change, received in subprocess 510, as a matrix that is the same size as $Y_{reduced}$ for frequency f, and with values representing the changes in the admittance values at each location.

In subprocess 530, each change matrix for a given frequency, generated in subprocess 520, is applied to the reduced bus matrix for that frequency in set 400 of reduced bus matrices, thereby producing a set of variation bus matrices. For example, to produce a set of variation bus matrices from a change that includes adding a new electrical component to the electrical network or increasing the parameter value of an electrical component, the change matrix for each frequency may be added to the reduced bus matrix for that frequency:

$$Y_{variation}(f) = Y_{reduced}(f) + Y_\Delta(f)$$

wherein $Y_{variation}\{f\}$ is the set of variation bus matrices for all frequencies f, $Y_{reduced}\{f\}$ is the set 400 of reduced bus matrices for all frequencies f, and $Y_A(f)$ is the change matrix. Similarly, to produce a set of variation bus matrices from a change that includes removing an existing electrical component from the electrical network or decreasing the parameter value of an electrical component, the change matrix for each frequency may be subtracted from the reduced bus matrix for that frequency:

$$Y_{variation}\{f\} = Y_{reduced}\{f\} - Y_\Delta(f)$$

In other words, applying the change matrix to a reduced bus matrix comprises adding or subtracting the change matrix for a frequency from the reduced bus matrix for that frequency using simple matrix algebra.

In subprocess 540, the set of variation bus matrices, produced by subprocess 530, may be output. In an embodiment in which the change was specified by a user in subprocess 510, subprocess 540 may comprise providing the set of variation bus matrices to the user via a graphical user interface generated by server application 112. In an embodiment in which the change was specified by analytic software, subprocess 540 may comprise returning the set of variation bus matrices to the analytic software. For example, process 500 may be implemented as a service (e.g., microservice) to which analytic software can send a change and from which the analytic software can receive the resulting set of variation bus matrices. Alternatively, process 500 could be incorporated as function into the analytic software itself.

In subprocess 550, the set of variation bus matrices that is output in subprocess 540 may be processed. This processing may comprise calculating the impedances, voltages, and/or currents at one or more buses in the electrical network, using the set of variation bus matrices. For example, in subprocess 550, the analytic software may perform circuit analysis based on the returned set of variation bus matrices.

In the event that K retains only a single bus in a reduced bus matrix, the corresponding variation bus matrix will consist of the parameter value (e.g., admittance value) of the entire electrical network observed at that single bus. In the event that K retains a plurality of buses in the reduced bus matrix, the voltages resulting from the injection of current from known sources, for a given frequency, can be computed from the variation bus matrix by the following equation:

$$V = Y_{variation}^{-1} I$$

wherein $$Y_{variation}^{-1}$$

is the inverse of the variation bus matrix in which each parameter value is an admittance value, V is a column vector of the resulting voltages, and I is a column vector of the injected currents.

In subprocess 550, the analytic software or other recipient of the set of variation bus matrices may utilize these equation(s), during circuit analysis, to calculate the voltage at each bus, given a set of injected currents I. Additionally or alternatively, the analytic software may perform other calculations (e.g., admittance-based and/or impedance-based calculations) using the set of variation bus matrices.

Control may be initiated based on the circuit analysis, performed by the analytic software using the set of variation bus matrices. For example, an operating configuration of the electrical network may be determined based on the circuit analysis. One or more control instructions may be generated to reconfigure the electrical network to the determined operating configuration. These control instructions may be transmitted by platform 110 to an EMS, SCADA, or other control system of the electrical network of a power system. The control instructions may instruct the control system to reconfigure one or more physical components of the electrical network, including opening or closing switches, adjusting setpoints, changing operating modes (e.g., turning a physical component on or off, bringing the physical component into service or out of service), and/or the like.

Process 500 may be used to evaluate one change in a system condition to the electrical network or a plurality of different changes in system conditions to the electrical network. For example, the analytic software may evaluate a plurality of different "what-if" scenarios or other potential variations in system conditions in the electrical network. In this case, an iteration of process 500 may be executed for each variation. In particular, a change matrix may be generated for each of a plurality of changed system conditions (e.g., in subprocesses 510 and 520), and the change matrix for each of the plurality of changed system conditions may be applied to each reduced bus matrix in set 400 of reduced bus matrices to produce a set of variation bus matrices for that changed system condition (e.g., in subprocesses 530 and 540). The set of variation bus matrices may then be processed as needed for the relevant study or control (e.g., in subprocess 550).

Each of the plurality of changed system conditions may represent a different topology in the electrical network than at least one other one of the plurality of changed system conditions. For purposes of calculating the set of variation bus matrices for a variation in topology, it is generally easiest to bring an electrical component fully into service or out of service by calculating the full parameter value (e.g., admittance) of the electrical component. However, the variation can also be implemented by modifying a parameter value. Empirically, it is generally best to start with all electrical components to be varied in service at their maximum admittance values in the reduced bus matrices, and then remove or reduce the admittance values to reflect electrical components being taken out of service.

4. EXAMPLE EMBODIMENTS

Disclosed embodiments generate a set 400 of reduced bus matrices for a plurality of frequencies in an electrical network of a power system. The plurality of frequencies may be a range of frequencies that includes the normal operating frequency of the electrical network. Set 400 of reduced bus matrices for the plurality of frequencies retains computational fidelity by capturing the influence of the full electrical network's frequency response, but without the additional efforts required to develop frequency-dependent equivalent networks representations for the extent of the electrical network that was eliminated.

To test variations in system conditions (e.g., for circuit analysis), a change matrix may be generated for each variation. Change matrices may applied to the set 400 of reduced bus matrices, using simple matrix algebra, to produce a set of variation bus matrices. The resulting set of variation bus matrices may be used in various types of circuit analysis (e.g., in subprocess 550). For example, the variation bus matrices may be used in power quality studies to estimate harmonic voltage and current distortion on a power system, determine network resonances, determine harmonic distortion, and/or the like. As another example, the variation bus matrices may be used as an input to filter designs for a variety of devices, such as high-voltage direct current (HVDC) systems, static synchronous compensator (STATCOM) systems, static voltage-amps reactive (VAR) compenstaor (SVC) systems, motor drives, inverter-based resources, or the like. As yet another example, the variation bus matrices may be used in sub-synchronous resonance studies for series-compensated electrical networks. Advantageously, the disclosed embodiments provide fast calculation of impedance and voltage values in the electrical network, thereby enabling many different system conditions (e.g., topologies) to be tested at lower computational burden.

Example Embodiments May Include

Embodiment 1: A method comprising using at least one hardware processor to: for each of a plurality of frequencies, acquire a square bus matrix for the frequency, wherein the square bus matrix comprises a row and a column corresponding to each of a plurality of buses within an electrical network of a power system, wherein each location on a diagonal of the square bus matrix represents a sum of parameter values of all electrical components of the electrical network that are connected to one of the plurality buses corresponding to both the row and the column, and wherein each location off the diagonal of the square bus matrix represents a parameter value between one of the plurality of buses corresponding to the row and one of the plurality of buses corresponding to the column, generate a reduced bus matrix for the frequency from the square bus matrix for the frequency, and add the reduced bus matrix to a set of reduced bus matrices for the plurality of frequencies, wherein each reduced bus matrix has a same size; generate a change matrix that is the same size as each reduced bus matrix, wherein the change matrix comprises a zero value at all locations not being changed; and apply the change matrix to each reduced bus matrix in the set of reduced bus matrices to produce a set of variation bus matrices.

Embodiment 2: The method of Embodiment 1, wherein each parameter value is an admittance value.

Embodiment 3: The method of Embodiment 1, wherein each parameter value is an impedance value.

Embodiment 4: The method of any preceding embodiment, wherein applying the change matrix comprises adding the change matrix.

Embodiment 5: The method of any preceding embodiment, wherein applying the change matrix comprises subtracting the change matrix.

Embodiment 6: The method of any preceding embodiment, wherein generating a reduced bus matrix for the frequency from the square bus matrix comprises removing one or more of the plurality of buses, while updating the parameter values for retained ones of the plurality of buses based on an influence from the removed one or more buses.

Embodiment 7: The method of any preceding embodiment, wherein generating a reduced bus matrix for the frequency from the square bus matrix comprises: partitioning the square bus matrix into $$\begin{bmatrix} K & L \\ L^T & M \end{bmatrix}$$

wherein K comprises the parameter values for the retained ones of the plurality of buses, M comprises the parameter values for the removed one or more buses, L comprises the parameter values between one of the retained one of the plurality of buses and one of the removed one or more buses, and $L^T$ is a transpose of L; and computing the reduced bus matrix as $K - LM^{-1}L^T$.

Embodiment 8: The method of any preceding embodiment, further comprising using the at least one hardware processor to perform circuit analysis based on the set of variation bus matrices.

Embodiment 9: The method of Embodiment 8, wherein the circuit analysis comprises computing a voltage for each of the plurality of buses in each variation bus matrix in the set of variation bus matrices based on one or more injected currents.

Embodiment 10: The method of Embodiment 8 or 9, wherein the circuit analysis comprises computing a voltage for each of the plurality of buses in each variation bus matrix in the set of variation bus matrices according to:

$$V = Y_{variation}^{-1} I$$

wherein V is a vector of voltages, $$Y_{variation}^{-1}$$

is an inverse of the variation bus matrix, and I is a vector of injected currents, and wherein each parameter value is an admittance value.

Embodiment 11: The method of any one of Embodiments 8 through 10, further comprising using the at least one hardware processor to initiate control of at least one of the electrical components of the electrical network based on the circuit analysis.

Embodiment 12: The method of any preceding embodiment, further comprising using the at least one hardware processor to: generate the change matrix for each of a plurality of changed system conditions; and for each of the plurality of changed system conditions, apply the change matrix generated for that changed system condition to each reduced bus matrix in the set of reduced bus matrices to produce a set of variation bus matrices for that changed system condition for the plurality of frequencies.

Embodiment 13: The method of Embodiment 12, wherein each of the plurality of changed system conditions represents a different topology in the electrical network than at least one other one of the plurality of changed system conditions.

Embodiment 14: A system comprising: at least one hardware processor; and software configured to, when executed by the at least one hardware processor, perform the method of any preceding embodiment.

Embodiment 15: A non-transitory computer-readable medium having instructions stored thereon, wherein the instructions, when executed by a processor, cause the processor to perform the method of any one of Embodiments 1 through 13.

The above description of the disclosed embodiments is provided to enable any person skilled in the art to make or use the invention. Various modifications to these embodiments will be readily apparent to those skilled in the art, and the general principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly not limited.

As used herein, the terms "comprising," "comprise," and "comprises" are open-ended. For instance, "A comprises B" means that A may include either: (i) only B; or (ii) B in combination with one or a plurality, and potentially any number, of other components. In contrast, the terms "consisting of," "consist of," and "consists of" are closed-ended. For instance, "A consists of B" means that A only includes B with no other component in the same context.

Combinations, described herein, such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, and any such combination may contain one or more members of its constituents A, B, and/or C. For example, a combination of A and B may comprise one A and multiple B's, multiple A's and one B, or multiple A's and multiple B's.

What is claimed is:

1. A method comprising using at least one hardware processor to:

for each of a plurality of frequencies, acquire a square bus matrix for the frequency, wherein the square bus matrix comprises a row and a column corresponding to each of a plurality of buses within an electrical network of a power system, wherein each location on a diagonal of the square bus matrix represents a sum of parameter values of all electrical components of the electrical network that are connected to one of the plurality buses corresponding to both the row and the column, and wherein each location off the diagonal of the square bus matrix represents a parameter value between one of the plurality of buses corresponding to the row and one of the plurality of buses corresponding to the column, generate a reduced bus matrix for the frequency from the square bus matrix for the frequency, and store the reduced bus matrix in a set of reduced bus matrices for the plurality of frequencies, wherein each reduced bus matrix has a same size;

generate a plurality of sets of variation bus matrices by, for each of a plurality of scenarios that each represents a change in system conditions to the electrical network, generating a change matrix that is the same size as each reduced bus matrix, wherein the change matrix comprises a non-zero value, representing a change in the parameter value, at all locations being changed for that scenario, and a zero value at all locations not being changed for that scenario, and applying the change matrix to each reduced bus matrix in the set of reduced bus matrices to produce one of the one or more sets of variation bus matrices, wherein the one set of variation bus matrices comprises a variation bus matrix for the scenario for each of the plurality of frequencies;

perform circuit analysis based on the one or more sets of variation bus matrices; and initiate control of at least one of the electrical components of the electrical network based on the circuit analysis, wherein the control comprises one or more of opening or closing switches, adjusting setpoints, or changing operating modes.

2. The method of claim 1, wherein each parameter value is an admittance value.

3. The method of claim 1, wherein each parameter value is an impedance value.

4. The method of claim 1, wherein applying the change matrix comprises adding the change matrix.

5. The method of claim 1, wherein applying the change matrix comprises subtracting the change matrix.

6. The method of claim 1, wherein generating a reduced bus matrix for the frequency from the square bus matrix comprises removing one or more of the plurality of buses, while updating the parameter values for retained ones of the plurality of buses based on an influence from the removed one or more buses.

7. The method of claim 6, wherein generating a reduced bus matrix for the frequency from the square bus matrix comprises:

partitioning the square bus matrix into $$\begin{bmatrix} K & L \\ L^T & M \end{bmatrix}$$

wherein K comprises the parameter values for the retained ones of the plurality of buses, M comprises the parameter values for the removed one or more buses, L comprises the parameter values between one of the retained one of the plurality of buses and one of the removed one or more buses, and $L^T$ is a transpose of L; and computing the reduced bus matrix as $K - L M^{-1} L^T$.

8. The method of claim 1, wherein the circuit analysis comprises computing a voltage for each of the plurality of buses in each variation bus matrix in the set of variation bus matrices according to:

$$V = Y_{variation}^{-1} I$$

wherein V is a vector of voltages, $$Y_{variation}^{-1}$$

is an invoice of un variation bus matrix, and I is a vector of injected currents, and wherein each parameter value is an admittance value.

9. The method of claim 1, wherein each of the plurality of scenarios represents a different topology in the electrical network than at least one other one of the plurality of scenarios.

10. A system comprising:

at least one hardware processor; and software configured to, when executed by the at least one hardware processor, for each of a plurality of frequencies, acquire a square bus matrix for the frequency, wherein the square bus matrix comprises a row and a column corresponding to each of a plurality of buses within an electrical network of a power system, wherein each location on a diagonal of the square bus matrix represents a sum of parameter values of all electrical components of the electrical network that are connected to one of the plurality buses corresponding to both the row and the column, and wherein each location off the diagonal of the square bus matrix represents a parameter value between one of the plurality of buses corresponding to the row and one of the plurality of buses corresponding to the column, generate a reduced bus matrix for the frequency from the square bus matrix for the frequency, and store the reduced bus matrix in a set of reduced bus matrices for the plurality of frequencies, wherein each reduced bus matrix has a same size, generate a plurality of sets of variation bus matrices by, for each of a plurality of scenarios that each represents a change in system conditions to the electrical network, generating a change matrix that is the same size as each reduced bus matrix, wherein the change matrix comprises a non-zero value, representing a change in the parameter value, at all locations being changed for that scenario, and a zero value at all locations not being changed for that scenario, and applying the change matrix to each reduced bus matrix in the set of reduced bus matrices to produce one of the one or more sets of variation bus matrices, wherein the one set of variation bus matrices comprises a variation bus matrix for the scenario for each of the plurality of frequencies, perform circuit analysis based on the one or more sets of variation bus matrices, and initiate control of at least one of the electrical components of the electrical network based on the circuit analysis, wherein the control comprises one or more of opening or closing switches, adjusting setpoints, or changing operating modes.

11. The system of claim 10, wherein each parameter value is an admittance value.

12. The system of claim 10, wherein each parameter value is an impedance value.

13. The system of claim 10, wherein applying the change matrix comprises adding or subtracting the change matrix.

14. The system of claim 10, wherein generating a reduced bus matrix for the frequency from the square bus matrix comprises removing one or more of the plurality of buses, while updating the parameter values for retained ones of the plurality of buses based on an influence from the removed one or more buses.

15. The system of claim 10, wherein the circuit analysis comprises computing a voltage for each of the plurality of buses in each variation bus matrix in the set of variation bus matrices based on one or more injected currents.

16. The system of claim 10, wherein the one or more scenarios are a plurality of scenarios, and wherein the one or more sets of variation bus matrices are a plurality of sets of variation matrices that comprise a variation bus matrix for each of the plurality of scenarios for each of the plurality of frequencies.

17. A non-transitory computer-readable medium having instructions stored thereon, wherein the instructions, when executed by a processor, cause the processor to:

for each of a plurality of frequencies, acquire a square bus matrix for the frequency, wherein the square bus matrix comprises a row and a column corresponding to each of a plurality of buses within an electrical network of a power system, wherein each location on a diagonal of the square bus matrix represents a sum of parameter values of all electrical components of the electrical network that are connected to one of the plurality buses corresponding to both the row and the column, and wherein each location off the diagonal of the square bus matrix represents a parameter value between one of the plurality of buses corresponding to the row and one of the plurality of buses corresponding to the column, generate a reduced bus matrix for the frequency from the square bus matrix for the frequency, and store the reduced bus matrix to a set of reduced bus matrices for the plurality of frequencies, wherein each reduced bus matrix has a same size;

generate a plurality of sets of variation bus matrices by, for each of a plurality of scenarios that each represents a change in system conditions to the electrical network, generating a change matrix that is the same size as each reduced bus matrix, wherein the change matrix comprises a non-zero value, representing a change in the parameter value, at all locations being changed for that scenario, and a zero value at all locations not being changed for that scenario, and applying the change matrix to each reduced bus matrix in the set of reduced bus matrices to produce one of the one or more sets of variation bus matrices, wherein the one set of variation bus matrices comprises a variation bus matrix for the scenario for each of the plurality of frequencies;

perform circuit analysis based on the one or more sets of variation bus matrices; and initiate control of at least one of the electrical components of the electrical network based on the circuit analysis, wherein the control comprises one or more of opening or closing switches, adjusting setpoints, or changing operating modes.

\*    \*    \*    \*    \*